United States Patent
Yamashita et al.

(10) Patent No.: US 9,332,686 B2
(45) Date of Patent: May 3, 2016

(54) LOWER SUPPORTING PIN LAYOUT DETERMINATION APPARATUS AND LOWER SUPPORTING PIN LAYOUT DETERMINATION METHOD

(75) Inventors: Shirou Yamashita, Yamanashi (JP); Tadashi Endo, Yamanashi (JP); Yasuichi Okada, Yamanashi (JP); Makoto Nakashima, Yamanashi (JP); Yuki Minamide, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 175 days.

(21) Appl. No.: 13/978,443

(22) PCT Filed: Sep. 11, 2012

(86) PCT No.: PCT/JP2012/005761
§ 371 (c)(1),
(2), (4) Date: Jul. 5, 2013

(87) PCT Pub. No.: WO2013/084387
PCT Pub. Date: Jun. 13, 2013

(65) Prior Publication Data
US 2013/0276281 A1    Oct. 24, 2013

(30) Foreign Application Priority Data
Dec. 6, 2011 (JP) .................................. 2011-266588

(51) Int. Cl.
H05K 13/08 (2006.01)
H05K 13/00 (2006.01)

(52) U.S. Cl.
CPC ............ H05K 13/08 (2013.01); H05K 13/0015 (2013.01); H05K 13/0061 (2013.01);
(Continued)

(58) Field of Classification Search
CPC .............. H05K 13/08; H05K 13/0061; H05K 13/0015; Y10T 29/49769; Y10T 29/53087; Y10T 29/53083; Y10T 29/49778; Y10T 29/49764; Y10T 29/49767

USPC .................. 29/407.04, 720, 407.01, 407.05, 29/407.09, 721
See application file for complete search history.

(56) References Cited

U.S. PATENT DOCUMENTS 5,694,219 A * 12/1997 Kim .............................. 356/615
5,940,960 A *  8/1999 Doan ...................... B23P 19/04
                                                            29/221.5

(Continued)

FOREIGN PATENT DOCUMENTS

JP    11340696    * 10/1999  ............. H05K 13/04
JP    11-340696 A   12/1999

(Continued)

OTHER PUBLICATIONS

Takeshi Miwa; Automatic Confirmation Device for Substrate Backup Pin Erecting Position of Electronic Part Mounting Device and Automatic Confirmation Method for Substrate Backup Pin Erecting Position Using the Same; May 13, 2004; USPTO English Translation; Mar. 2015; pp. 1-34.*

(Continued)

*Primary Examiner* — David Bryant
*Assistant Examiner* — Bayan Salone
(74) *Attorney, Agent, or Firm* — Pearne & Gordon LLP (57) ABSTRACT

A lower supporting pin module 22 is given a shape having a contact surface 26a. On the occasion of position recognition for determining a position of a pin on the lower supporting pin module 22, an image of the lower supporting pin module 22 is captured, and the image is subjected to recognition processing, to thus detect an outer shape of an upper shaft 24B. Even when an extraneous matter on a downside surface of a substrate adheres to the contact surface 26a, the position of the lower supporting pin module 22 can be stably recognized with superior recognition precision.

4 Claims, 7 Drawing Sheets

(52) U.S. Cl.
CPC ...... *Y10T29/49764* (2015.01); *Y10T 29/49767* (2015.01); *Y10T 29/49769* (2015.01); *Y10T 29/49778* (2015.01); *Y10T 29/53083* (2015.01); *Y10T 29/53087* (2015.01)

(56) References Cited

U.S. PATENT DOCUMENTS

| | | | | |
|---|---|---|---|---|
| 6,212,751 | B1* | 4/2001 | Hattori | 29/407.04 |
| 6,438,822 | B1* | 8/2002 | Hattori | 29/739 |
| 6,585,245 | B2* | 7/2003 | Isogai et al. | 269/21 |
| 6,931,716 | B2* | 8/2005 | Suhara | H05K 13/08 29/720 |
| 7,275,314 | B2* | 10/2007 | Yakiyama et al. | 29/832 |
| 7,336,816 | B2* | 2/2008 | Sasazawa | G01B 11/0608 250/559.19 |
| 7,551,768 | B2* | 6/2009 | Okada et al. | 382/145 |
| 7,810,050 | B2* | 10/2010 | Hirai | G06F 3/0425 345/173 |
| 8,561,285 | B1* | 10/2013 | Vangal-Ramamurthy et al. | 29/603.03 |
| 8,805,585 | B2* | 8/2014 | Nishihara | 700/256 |
| 8,845,114 | B2* | 9/2014 | Okada et al. | 362/3 |
| 8,863,371 | B2* | 10/2014 | Brouwer et al. | 29/714 |
| 9,226,436 | B2* | 12/2015 | Okuda | H05K 13/0413 |
| 2002/0138974 | A1* | 10/2002 | Suhara | H05K 13/08 29/740 |
| 2004/0213450 | A1* | 10/2004 | Okada et al. | 382/145 |
| 2005/0128344 | A1* | 6/2005 | Suhara | H05K 13/08 348/370 |
| 2005/0129304 | A1* | 6/2005 | Sasazawa | G01B 11/0608 382/150 |
| 2005/0210667 | A1* | 9/2005 | Yakiyama et al. | 29/740 |
| 2006/0075631 | A1* | 4/2006 | Case et al. | 29/709 |
| 2007/0124922 | A1* | 6/2007 | Kawasumi et al. | 29/739 |
| 2008/0099253 | A1* | 5/2008 | Ishikura et al. | 178/18.01 |
| 2008/0163131 | A1* | 7/2008 | Hirai | G06F 3/0425 715/863 |
| 2009/0046921 | A1* | 2/2009 | Case et al. | 382/145 |
| 2010/0060724 | A1* | 3/2010 | Yamauchi et al. | 348/61 |
| 2010/0097461 | A1* | 4/2010 | Utsumi | H05K 13/0413 348/143 |
| 2010/0118508 | A1* | 5/2010 | Okada et al. | 362/3 |
| 2012/0311854 | A1* | 12/2012 | Yamauchi et al. | 29/729 |
| 2012/0317803 | A1* | 12/2012 | Kitagawa et al. | 29/832 |
| 2012/0320188 | A1* | 12/2012 | Yamasaki et al. | 348/87 |
| 2013/0286186 | A1* | 10/2013 | Okada et al. | 348/87 |
| 2013/0291379 | A1* | 11/2013 | Yamashita et al. | 29/837 |
| 2013/0298382 | A1* | 11/2013 | Yamashita et al. | 29/559 |
| 2014/0201998 | A1* | 7/2014 | Yamashita et al. | 29/854 |

FOREIGN PATENT DOCUMENTS

| | | | | |
|---|---|---|---|---|
| JP | 2004-140161 A | | 5/2004 | |
| JP | 2004140161 A | * | 5/2004 | ............ H05K 13/04 |
| JP | 4014270 B2 | | 9/2007 | |
| JP | 4014270 A | * | 11/2007 | ............ H05K 13/04 |
| JP | 2010-141053 A | | 6/2010 | |
| JP | 2010141053 A | * | 6/2010 | ............ H05K 13/04 |
| JP | 2011-014726 A | | 1/2011 | |
| JP | 2011014726 A | * | 1/2011 | ............ H05K 13/00 |

OTHER PUBLICATIONS

International Search Report for PCT/JP2012/005761 dated Oct. 23, 2012.

\* cited by examiner

LOWER SUPPORTING PIN LAYOUT DETERMINATION APPARATUS AND LOWER SUPPORTING PIN LAYOUT DETERMINATION METHOD

TECHNICAL FIELD

The present invention relates to a lower supporting pin layout determination apparatus and a lower supporting pin layout determination method for determining whether or not a layout of lower supporting pins for receiving an downside of a substrate in an electronic parts mounting apparatus is appropriate.

BACKGROUND ART

In a parts mounting process for mounting electronic parts on a substrate, the substrate is positioned and held while its downside is supported by a downside receiving section. A lower supporting pin method for supporting a downside of a substrate while a plurality of lower supporting pins remain in contact with the downside has widely been used as the method for receiving a downside of a substrate. Under the lower supporting pin method, when parts have already been mounted on a downside of a substrate in a preceding process, the lower supporting pins must be positioned by selecting locations where the lower supporting pins can receive the downside without interfering with the positions of the already-existing parts. After completion of work for positioning pins, a check is performed as to whether or not the lower supporting pins are actually positioned at the thus-selected correct locations. A method known as the method for checking the positions of the lower supporting pins is for recognizing leading ends, which remain in contact with the substrate, with a camera, thereby detecting positions of the lower supporting pins (see; for instance, Patent Document 1).

RELATED ART DOCUMENT

Patent Document

Patent Document 1: Japanese Patent No. 4014270

SUMMARY OF THE PRESENT INVENTION

Problem that the Present Invention is to Solve

However, in the above mentioned example of the related-art, inconvenience, such as that will be described below, has occurred for the reason that a surface, which is a target of recognition for position detection, is a leading end of the lower supporting pin that is to come into contact with the substrate. Specifically, paste-like extraneous matters, such as flux, frequently remain attached to the downside of the substrate in the preceding process. In a state where the lower supporting pins have been used in work for receiving a plurality of substrates, the extraneous matters adhere to the leading ends of the lower supporting pins. For these reasons, there is a potential risk of recognition accuracy achieved when images of the leading ends of the lower supporting pins are captured by a camera to recognize the position being deteriorated by presence of the extraneous matters, thereby posing difficulty in stable position recognition and inducing erroneous recognition.

Accordingly, the present invention aims at providing a lower supporting pin layout determination apparatus and a lower supporting pin layout determination method that enable stable recognition of positions of lower supporting pins with superior recognition accuracy.

Means for Solving the Problem

A lower supporting pin layout determination apparatus of the present invention is directed toward a lower supporting pin layout determination apparatus which determines whether or not a lower supporting pin for receiving a downside of a substrate is correctly arrayed in an electronic parts mounting apparatus that mounts electronic parts on the substrate held by a substrate holding section, wherein the lower supporting pin has a shape including a base to be supported by a support plate placed in the substrate holding section, a shaft extending upward from the base, a smaller-diameter section that is on an upper portion of the shaft and in which an outer diameter of the shaft becomes smaller, and a contact surface that is formed on top of the smaller-diameter section and that contacts and receives a downside surface of the substrate; and the apparatus has an imaging unit that captures an image of the lower supporting pin from above, to thus acquire a planar image;

a shaft shape detection section that subjects the image to recognition processing, to thus detect an outer shape of the shaft at a recognition reference position set at a height where a transition occurs from an outer periphery of the shaft section to the smaller-diameter section; and a pin layout determination section that compares a planar position of the lower supporting pin determined from the detected outer shape with preset pin layout data, thereby determining whether or not the lower supporting pin is correctly arrayed.

A lower supporting pin layout determination method of the present invention is directed toward a lower supporting pin layout determination method for determining whether or not a position of an lower supporting pin which receives a downside of a substrate in an electronic parts mounting apparatus that mounts electronic parts on the substrate held by a substrate holding section, wherein the lower supporting pin has a shape including a base to be supported by a support plate placed in the substrate holding section, a shaft extending upward from the base, and a smaller-diameter section that is on an upper portion of the shaft and in which an outer diameter of the shaft becomes smaller, a contact surface that is formed on top of the smaller-diameter section and that contacts and receives a downside surface of the substrate; and the method includes an imaging step of capturing an image of the lower supporting pin from above, to thus acquire a planar image;

a shaft shape detection step of subjecting the image to recognition processing, to thus detect an outer shape of the shaft at a recognition reference position set at a height where a transition occurs from an outer periphery of the shaft to the smaller-diameter section; and a pin layout determination step of comparing a planar position of the lower supporting pin determined from the detected outer shape with preset pin layout data, thereby determining whether or not the lower supporting pin is correctly arrayed.

Advantage of the Present Invention

According to the present invention, the lower supporting pin for receiving a downside of a substrate has given a shape including a shaft extending upward from a base, a smaller-diameter section that is on an upper portion of the shaft and in which an outer diameter of the shaft becomes smaller, and a contact surface that is formed on top of the smaller-diameter section and that contacts and receives a downside surface of the substrate. On the occasion of detection of a position of the pin for determining the position of the pin, an image of the lower supporting pin is captured from above, to thus acquire a planar view of the lower supporting pin. The image is subjected to recognition processing, thereby detecting an outer shape of the shaft at a recognition reference position set at a height where a transition occurs from a periphery of the shaft to the smaller-diameter section. Even when an extraneous matter on the downside surface of the substrate adheres to the contact surface, the position of the lower supporting pin can be stably recognized with superior recognition precision.

EMBODIMENT FOR IMPLEMENTING THE PRESENT INVENTION

Figure 1:
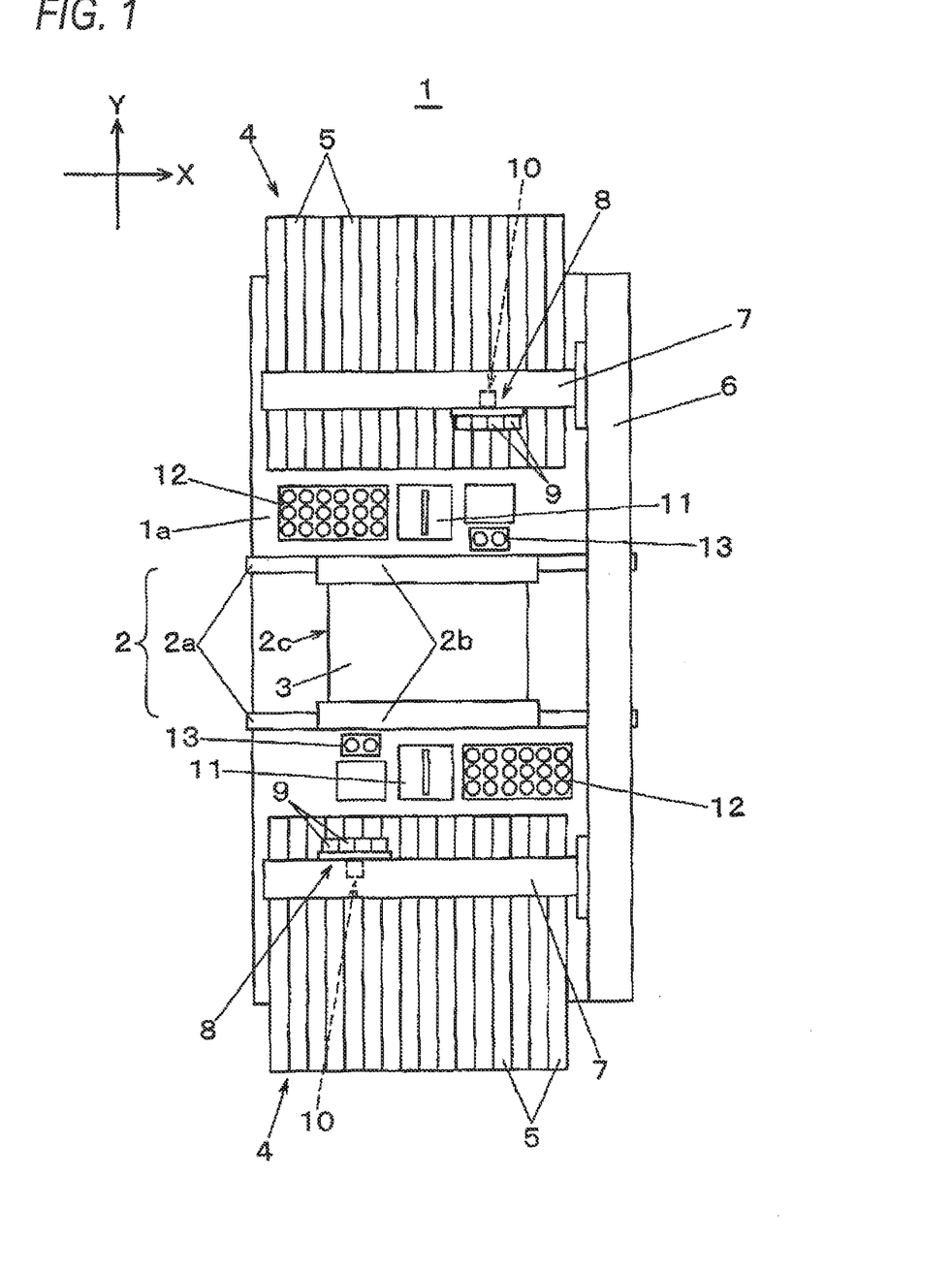
FIG. 1 is a plan view showing a configuration of an electronic parts mounting apparatus of an embodiment of the present invention.

An embodiment of the present invention is now described by reference to the drawings. First, an overall configuration of an electronic parts mounting apparatus 1 is described by reference to FIG. 1 and (a) and (b) in FIG. 2. The electronic parts mounting apparatus 1 has a function of mounting electronic parts on a substrate hold by a substrate holding section. In FIG. 1, a substrate conveyance mechanism 2 is positioned at a center of a bench 1a in an X direction (a direction of conveyance of a substrate). The substrate conveyance mechanism 2 has a function of conveying a substrate 3, which is carried into the substrate conveyance mechanism 2 from an upstream side, and positioning the substrate 3 at a mount work position by a parts mounting mechanism to be described below. The substrate conveyance mechanism 2 has two conveyance rails 2a laid in parallel with each other. At a center of the substrate conveyance mechanism 2, a substrate holding section 2c for receiving and holding the downside of the carried-in substrate 3 and press members 2b for pressing and clamping mutually-opposed two lateral ends of the substrate 3 raised by the substrate holding section 2c from above, are disposed.

A parts feed section 4 for feeding electronic parts that are targets of mounting is disposed on either side of the substrate conveyance mechanism 2. A plurality of tape feeders 5 are placed side by side in the individual parts feed section 4. The individual tape feeder 5 has a function of pitch-feeding a part held on a carrier tape to an eject position by a parts mounting mechanism to be described hereinbelow. A Y-axis movable table 6 is placed at an elevated position on one end of a top surface of the bench 1a in the X direction, and two X-axis movable tables 7 are joined to the Y-axis movable table 6 so as to be slidable in a Y direction. A mount head 8 is attached to each of the X-axis movable tables 7 so as to be slidable in the X direction.

The mount head 8 is a multiple head made up of a plurality of unit holding heads 9. A pickup nozzle 9a for picking up a part (see FIG. 4), which is attached to a nozzle holder at a lower end of the individual unit holding head 9, holds by vacuum suction an electronic part which is a target of mounting and which is fed from the tape feeder 5. The Y-axis movable table 6 and the X-axis movable tables 7 make up a head moving mechanism for moving the mount heads 8. By actuating the head moving mechanism, the individual mount head 8 moves between the parts feed section 4 and the substrate 3 positioned and hold by the substrate holding section 2c and moves up and down with respect to the substrate 3, thereby mounting the hold electronic part to the substrate 3. The mount head 8 and the head moving mechanism for moving the mount head 8 make up a parts mounting mechanism 14 that picks up a part from the corresponding parts feed section 4 and mounts the part on the substrate 3.

A substrate recognition camera 10 that moves integrally along with the mount head 8 is attached to an underside of the individual X-axis movable table 7. The substrate recognition camera 10 is moved to an elevated location above the substrate 3 hold by the substrate conveyance mechanism 2 by actuation of the head moving mechanism, whereby the substrate recognition camera 10 captures an image of a recognition mark made on the substrate 3. A parts recognition camera 11, a first nozzle housing 12, and a second nozzle housing 13 are disposed along a travel path of the mount head 8 between the parts feed section 4 and the substrate conveyance mechanism 2. The mount head 8 that has picked up a part from the parts feed section 4 performs scanning operation that passes through an elevated position above the parts recognition camera 11 in a predetermined direction, whereby the parts recognition camera 11 captures an image of a part hold by the corresponding mount head 8.

The plurality of pickup nozzles 9a attached to the nozzle holder of the unit holding head 9 are housed and held, in correspondence with parts types, within the first nozzle housing 12. Likewise, housed and held in the second nozzle housing 13 are pin transfer nozzles (omitted from the drawings) that are attached to the nozzle holder of the unit holding head 9 and used for a lower supporting pin module 22 to be described later. The individual mount head 8 accesses the first nozzle housing 12 and the second nozzle housing 13, to thus perform nozzle replacement operation, whereby the pickup nozzles to be attached to the unit holding head 9 can be replaced in accordance with an objective and a type of target part.

Figure 2:
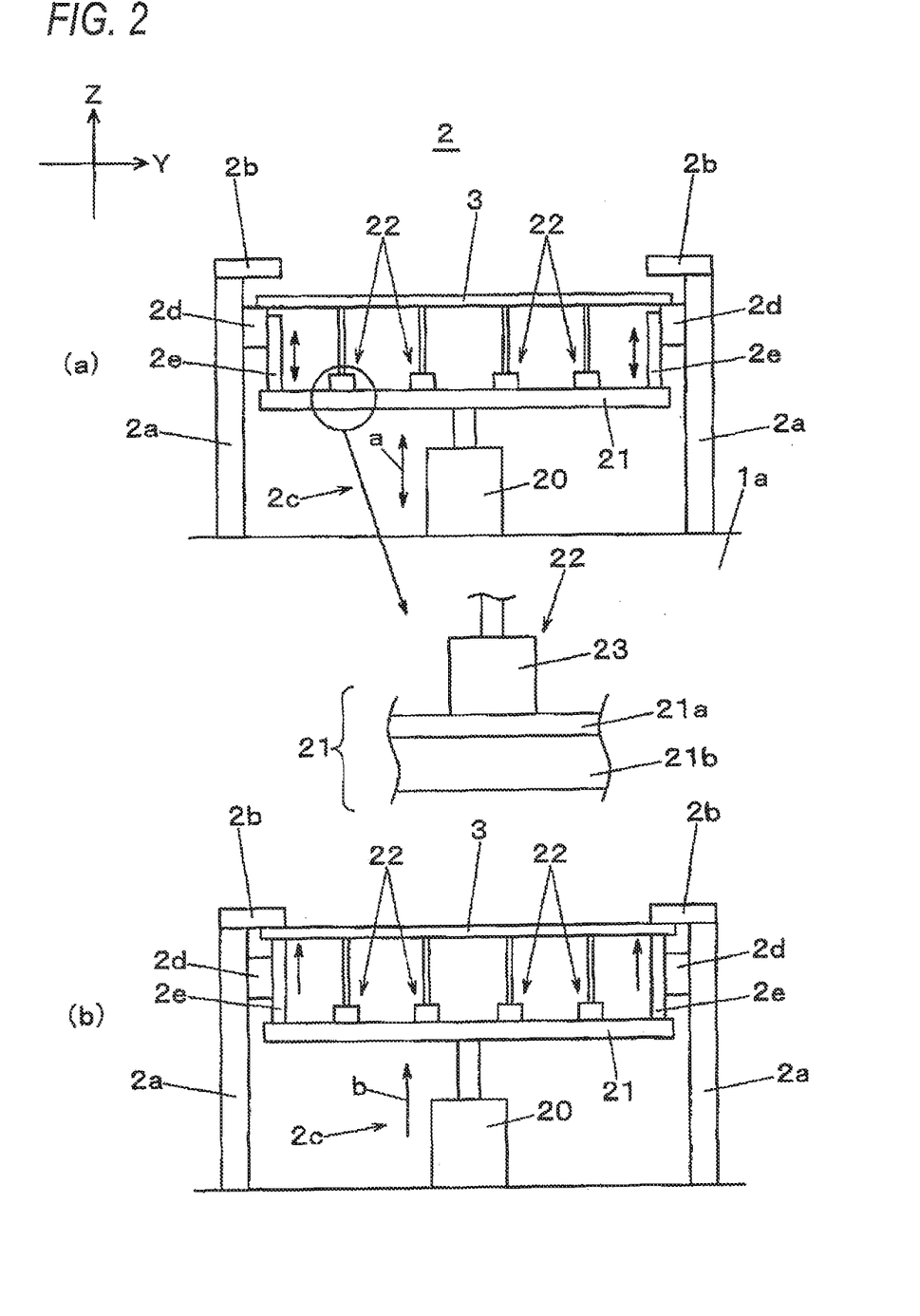
FIG. 2 is view in which (a) and (b) are explanatory views of a configuration for describing a substrate conveyance mechanism and a substrate holding section in the electronic parts mounting apparatus of the embodiment of the present invention.

By reference to (a) and (b) in FIG. 2, a configuration and a function of the substrate conveyance mechanism 2 are described. As shown in (a) and (b) in FIG. 2, the substrate conveyance mechanism 2 is made up of the two conveyance rails 2a laid in parallel with each other. A conveyor mechanism 2d is placed inside each of the conveyance rails 2a along a direction of conveyance. The conveyance mechanisms 2d are actuated while both lateral ends of the substrate 3 remains in contact with top surfaces of the conveyance mechanisms 2d, whereby the substrate 3 is conveyed in the direction of conveyance of a substrate. Further, placed inside the conveyor mechanisms 2d are clamp sections 2e for supporting the lateral ends of the substrate from below that, when the lateral ends of the substrate are pressed and clamped from above by the press members 2b, come into contact with a support plate 21, to thus move up and down the lateral ends. The substrate holding section 2c is placed in a center of the substrate conveyance mechanism 2 in correspondence with a work position for the parts mounting mechanism 14.

The substrate holding section 2c is configured so as to lift up and lower (along arrow "a") the horizontal plate-like support plate 21 by an elevation mechanism 20. The lower supporting pin modules 22 (lower supporting pins) for supporting the substrate 3 from its downside are provided upright on a top surface of the support plate 21. The support plate 21 is configured by covering a top surface of a plate member 21b made of a non-magnetic substance, like aluminum, with a magnetic substance 21a, like a steel plate. The lower supporting pin modules 22 are placed at arbitrary positions on the magnetic substance 21a, in accordance with positions for receiving the downside of the substrate 3 whose downside is to be received by the lower supporting pin modules 22.

In the downside-received state, by magnet members accommodated in respective bases 23 of the lower supporting pin modules 22, the lower supporting pin modules 22 are fastened to the support plate 21 by dint of attracting magnetic force which acts between the lower supporting pin modules 22 and the magnetic substance 21a. Incidentally, a manner of fixing the lower supporting pin modules 22 is not always limited to a method for using attracting magnetic force originating from a magnet member. For instance, there can also be employed a method for positioning and holding the lower supporting pin modules 22 by self-weight of the bases 23 and a method for opening attachment holes to be used for positioning and holding the lower supporting pin modules 22 in the support plate 21 and fixedly inserting the lower supporting pin modules 22 into the attachment holes, respectively.

In this state, as shown in (b) in FIG. 2, the support plate 21 is lifted (as designated by arrow "b") by actuation of the elevation mechanism 20. Upper ends of the respective lower supporting pin modules 22 and upper ends of the clamp sections 2e thereby come into contact with the downside of the substrate 3, and the downside of the substrate 3 is received and hold by the substrate holding section 2c. Further, both ends of the substrate 3 are pressed against the downsides of the respective press members 2b, to thus be fixedly positioned.

Figure 3:
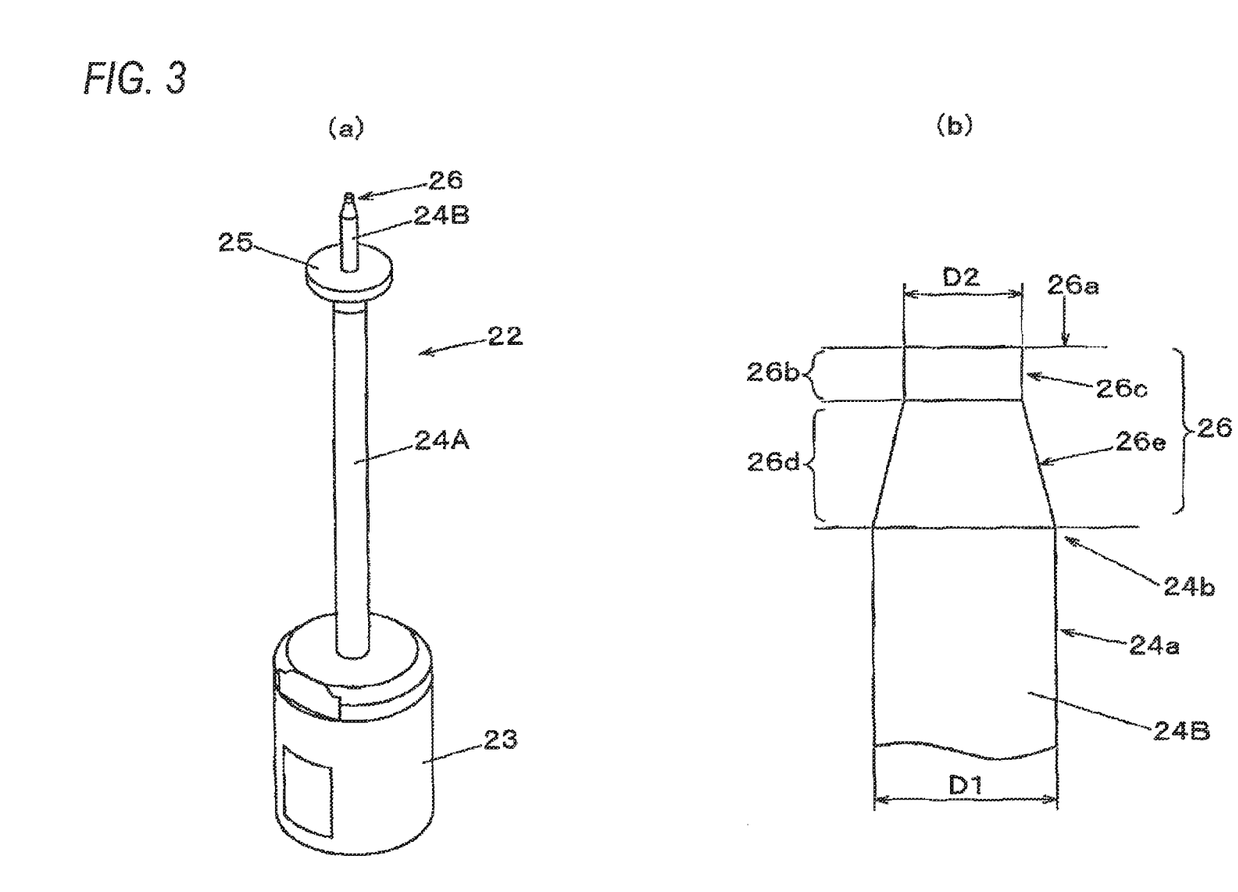
FIG. 3 is view in which (a) and (b) are explanatory views for describing a configuration of a lower supporting pin module used in the substrate holding section of the electronic parts mounting apparatus of the embodiment of the present invention.

By reference to (a) and (b) in FIG. 3, a configuration of the individual lower supporting pin module 22 is now described. The lower supporting pin modules 22 stand upright at arbitrary locations on the support plate 21 and exhibit the function of receiving and supporting the downside of the substrate 3 from below. As shown in (a) in FIG. 3, each of the lower supporting pin modules 22 is configured such that a lower shaft 24A extends upwards from the base 23 that is to contact the support plate 21 and that an upper shaft 24B which is smaller in diameter than the lower shaft 24A extends further upwards from a flange 25 provided on an upper end of the lower shaft 24A. The flange 25 is used when the lower supporting pin modules 22 are hold by suction by the pin transfer nozzle which is removably attached to the unit holding head 9.

Each of the lower shaft 24A and the upper shaft 24B is provided so as to assume a circular cross sectional profile. A smaller-diameter section 26 that is smaller in outer diameter than the upper shaft 24B is provided in an upper portion of the upper shaft 24B. As shown in (b) in FIG. 3, a top surface of the smaller-diameter section 26 serves as a contact surface 26a that comes into contact with a downside surface 3a (see (a) in FIG. 6) of the substrate 3 to thus support the downside surface. An outer diameter D2 of the contact surface 26a is set so as to become smaller than an outer diameter D1 of the upper shaft 24B. Specifically, the smaller-diameter section 26 is made up of a small diameter portion 26b that has the outer diameter D2 which is smaller than the outer diameter D1 of the upper shaft 24B and that has on its top the contact surface 26a; and a tapered portion 26d that connects a periphery 26c of the small diameter portion 26b to a periphery 24a of the upper shaft 26B by a conical tapered surface 26e.

Figure 4:
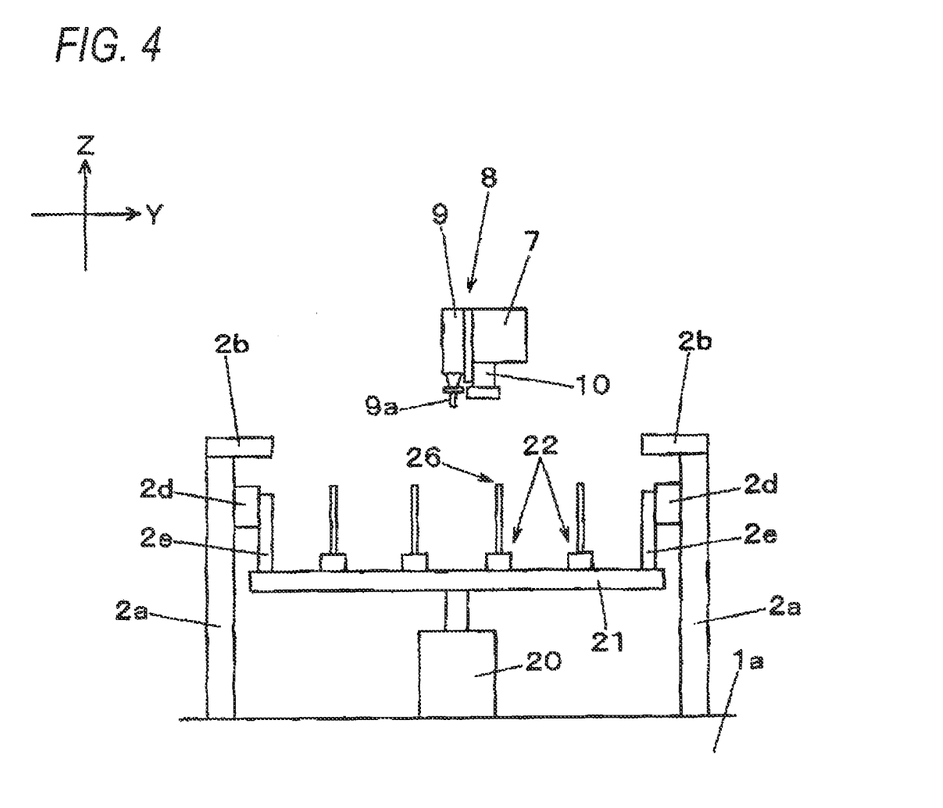
FIG. 4 is a partial cross section of the electronic parts mounting apparatus of the embodiment of the present invention.

The smaller-diameter sections 26 become targets of position recognition of the substrate recognition camera 10 in lower supporting pin layout determination for determining whether or not the lower supporting pin module 22 is correctly arrayed on the support plate 21. Specifically, after completion of lower supporting pin arraying work, the corresponding mount head 8 is moved, thereby sequentially moving the substrate recognition camera 10 to each of elevated positions above the respective lower supporting pin modules 22 as shown in FIG. 4. Images of the lower supporting pin modules 22 are captured from above by the substrate recognition camera 10 serving as imaging unit, thereby acquiring planar images of the respective lower supporting pin modules 22. The images are subjected to recognition processing, thereby detecting positions of the respective lower supporting pin modules 22 that are targets of imaging, as will be described later.

Figure 5:
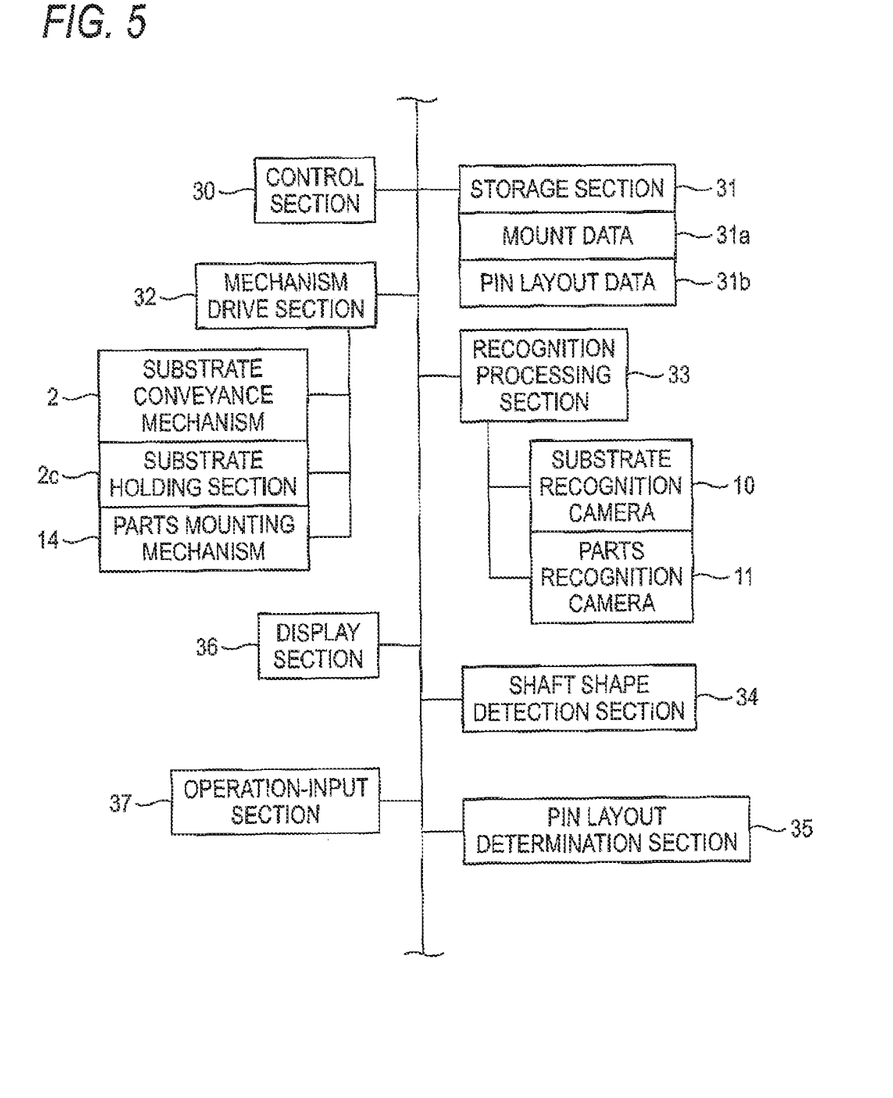
FIG. 5 is a block diagram showing a configuration of a control system of the electronic parts mounting apparatus of the embodiment of the present invention.

By reference to FIG. 5, a configuration of a control system is now described. A control section 30 is an arithmetic logic unit and controls individual sections to be described below in accordance with various programs and data stored in a storage section 31. In addition to mount data 31a used for mounting electronic parts on the substrate 3, pin layout data 31b are also stored in the storage section 31. The pin layout data 31b are position coordinate data used for positioning the lower supporting pin modules 22 on the support plate 21 and stored according to each type of the substrate 3. A mechanism actuation section 32 actuates the substrate conveyance mechanism 2, the substrate holding section 2c, and the parts mounting mechanism 14 under control of the control section 30. Thereby, the substrate conveyance mechanism 2 performs operation for conveying the substrate 3; the substrate holding section 2c performs operation for holding a substrate; and the parts mounting mechanism 14 performs operation for mounting parts.

A recognition processing section 33 subjects results of imaging performed by the substrate recognition camera 10 and the parts recognition camera 11 to recognition processing. The position of the substrate 3 is thereby recognized, and positions of the electronic parts hold by the mount head 8 are detected. When the parts mounting mechanism 14 mounts the electronic parts on the substrate 3, corrections are made to loading positions based on a recognition result. A shaft shape detection section 34 performs, on the basis of a result of recognition processing performed by the recognition processing section 33, processing for detecting an outer shape of the upper shaft 24B at a recognition reference position 24b set at the height where a transition occurs from the periphery 24a of the upper shaft 24B to the smaller-diameter section 26. A pin layout determination section 35 compares a planar position of the lower supporting pin module 22 determined from the outer shape of the upper shaft 24B detected by the shaft shape detection section 34 with the preset pin layout data 31b, thereby determining whether or not the lower supporting pin module 22 is correctly arrayed.

A display section 36 is a display device, like a liquid crystal panel, and displays an image acquired by the substrate recognition camera 10, a recognized image to be processed by the recognition processing section 33 and the shaft shape detection section 34, and a determination result yielded by the pin layout determination section 35. An operation-input section 37 is an input device, like a keyboard and a touch panel appearing on the display screen of the display section 36, and operation instruction or operation for inputting data is performed by way of the operation-input section 37. In relation to the above configuration, the substrate recognition camera 10, the recognition processing section 33, the shaft shape detection section 34, and the pin layout determination section 35 make up, in the electronic parts mounting apparatus 1 for mounting electronic ports on the substrate 3 holded by the substrate holding section 2c, a lower supporting pin layout determination apparatus for determining whether or not the lower supporting pin modules 22 for receiving the substrate 3 from below are correctly arrayed.

Figure 6:
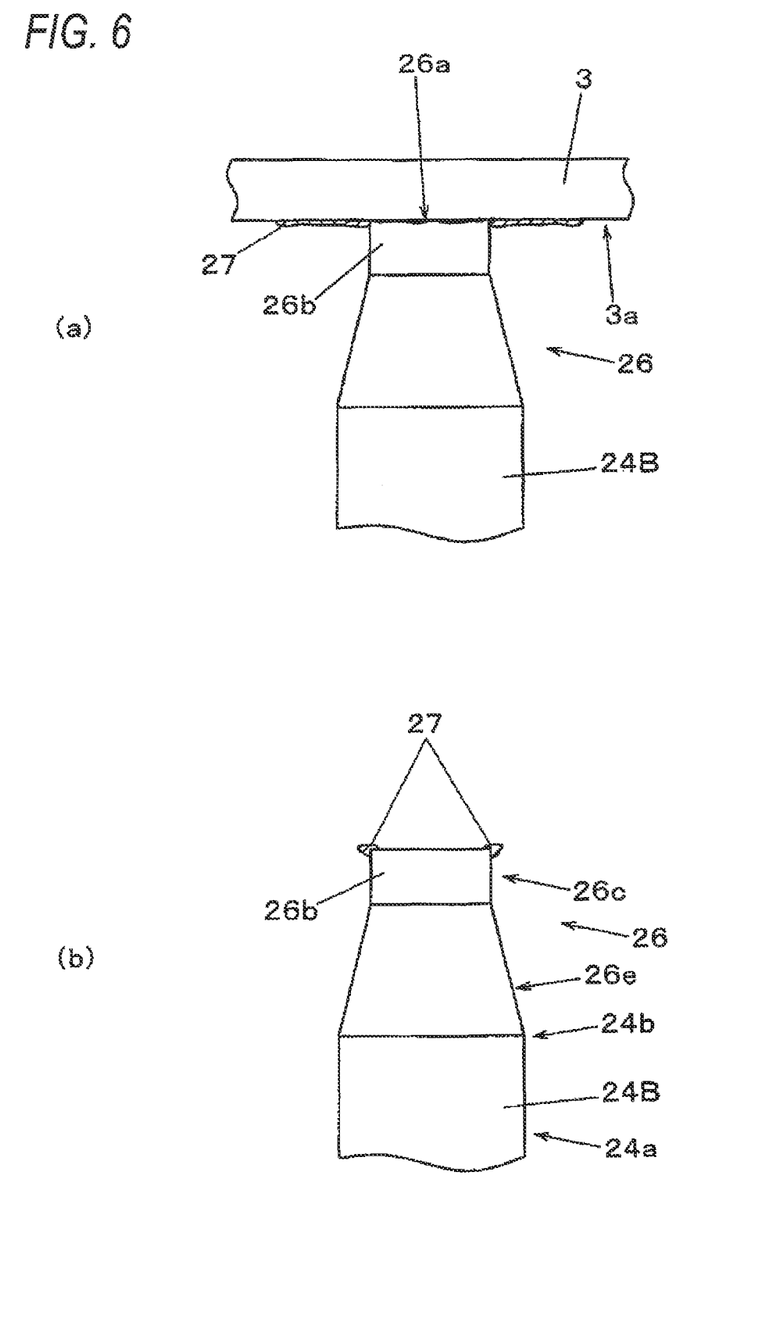
FIG. 6 is view in which (a) and (b) are explanatory views for determining positions of lower supporting pins in the electronic parts mounting apparatus of the embodiment of the present invention.
Figure 7:
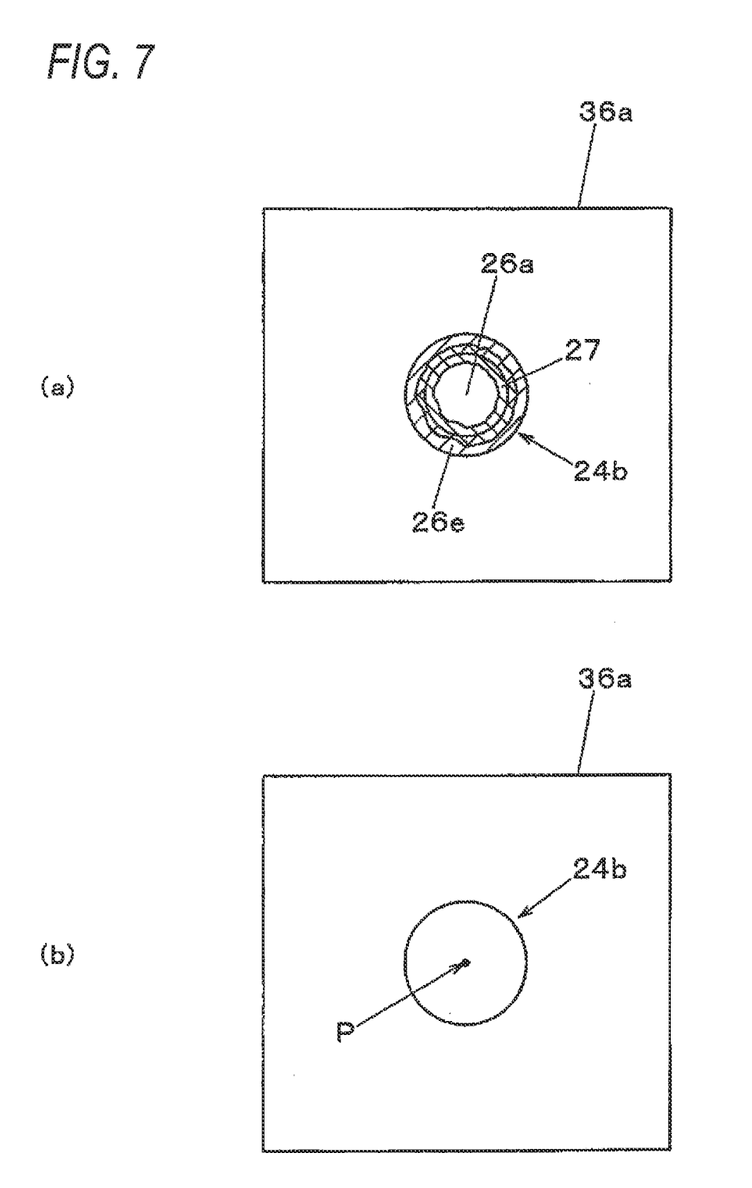
FIG. 7 is view in which (a) and (b) are explanatory views for determining positions of the lower supporting pins in the electronic parts mounting apparatus of the embodiment of the present invention.

By reference to (a) and (b) in FIG. 6 and (a) and (b) in FIG. 7, explanations are given to a lower supporting pin layout determination method for determining whether or not the lower supporting pin modules 22 are correctly arrayed on the support plate 21 in the electronic parts mounting apparatus 1 having the foregoing configuration. (a) in FIG. 6 shows a state of the downside surface 3a and the smaller-diameter section 26 achieved in a process of continually receiving from below the plurality of substrates 3 by the lower supporting pin modules 22. A paste-like extraneous matter 27, such as flux, adheres to the downside surface 3a of the substrate 3 for reasons of work in a preceding process. In a state in which the lower supporting pin modules 22 have been used in work for receiving the downsides of the plurality of substrates 3, the extraneous matter 27 adheres to the contact surface 26a at a leading end of the individual smaller-diameter section 26. (b) in FIG. 6 shows a state in which the support plate 21 is lowered, to thus separate the smaller-diameter section 26 from the downside surface 3a. In this state, the extraneous matter 27 adheres to the small diameter portion 26b while running off the periphery 26c to the outside.

On the occasion of switching a type of a substrate to be produced, the smaller-diameter section 26 in this state becomes a target of imaging operation to be performed by the substrate recognition camera 10 during lower supporting pin layout determination processing that is performed after work for switching positions of the lower supporting pin modules 22. Specifically, the substrate recognition camera 10 is integrally moved along with the mount head 8, to thus capture an image of the individual lower supporting pin module 22 from above and acquire a planar image of the lower supporting pin module 22 as shown in FIG. 4 (an imaging process). (a) in FIG. 7 shows a screen that is thus acquired and displayed as a recognized image 36a on the display section 36.

In this image, an area of a background image in a bright image, which corresponds to the conical tapered surface 26e, appears as a dark image. In the meantime, another area of the contact surface 26a without adhesion of the extraneous matter 27 appears as a bright image. Specifically, in the recognized image 36a, a contour of the recognition reference position 24b in the background image of the conical tapered surface 26e is not affected by adhesion of the extraneous matter 27. However, a contour of the contact surface 26a does not appear in the bright image under influence of the extraneous matter 27 adhering to the contact surface 26a. The shaft shape detection section 34 processes the thus-acquired recognized image 36a, thereby detecting an outer shape of the upper shaft 24B obtained at the recognition reference position 24b set at the height where a transition occurs from the periphery 24a of the upper shaft 24B to the smaller-diameter section 26 (a shaft shape detection process).

(b) in FIG. 7 shows an outer shape of the upper shaft 24B at the thus-detected recognition reference position 24b. During detection of the outer shape, the contour of the recognition reference position 24b is not affected by adhesion of the extraneous matter 27. Hence, when compared with a case where the contact surface 26a is taken as an object of recognition, more accurate recognition precision can be assured. A center point of the contour of the recognition reference position 24b is next determined, whereby a pin layout P representing a planar position of the lower supporting pin module 22 is detected. The thus-detected pin layout P is compared with the preset pin layout data 31b, thereby determining whether or not the lower supporting pin module 22 is correctly arrayed (the pin layout determination process), and a determination result is displayed and reported to the display section 36.

As described above, with regard to the determination as to the layout of the lower supporting pin in the electronic parts mounting apparatus 1 described in connection with the embodiment, the lower supporting pin module 22 serving as a lower supporting pin that receives the downside of the substrate 3 placed on the substrate holding section 2c assumes a shape including the lower shaft 24A upwardly extending from the base 23, the upper shaft 24B, the smaller-diameter section 26 with a smaller outer diameter in an upper portion of the upper shaft 24B, and the contact surface 26a that contacts the downside surface 3a of the substrate 3 formed on top of the smaller-diameter section 26. On the occasion of position recognition for determining pin layouts, an image of the lower supporting pin module 22 is captured from above, and the thus-captured planar image is subjected to recognition processing, thereby detecting an outer shape of the upper shaft 24B at the recognition reference position 24b set at the height where a transition occurs from the outer periphery of the upper shaft 24B to the smaller-diameter section 26. Even when the extraneous matter 27 on the downside surface 3a of the substrate 3 adheres to the contact surface 26a, the position of the lower supporting pin module 22 can be stably recognized with superior recognition precision.

The embodiment illustrates the example that employs as a lower supporting pin the lower supporting pin module 22 made by joining of the lower shaft 24A and the upper shaft 24B that differ from each other in radial diameter. However, there can also be adopted a configuration in which shafts having the same diameter extend from the base 23. Moreover, a combination of the smaller-diameter section 26b with the tapered portion 26d is illustrated as the smaller-diameter section 26. Another shape, however, can also be adopted, so long as the outer diameter D2 of the contact surface 26a becomes smaller than the outer diameter D1 of the upper shaft 24B.

The patent application is based on Japanese Patent Application (JP-2011-266588) filed on Dec. 6, 2011, the subject matter of which is incorporated herein by reference in its entirety.

INDUSTRIAL APPLICABILITY

A lower supporting pin layout determination apparatus and a lower supporting pin layout determination method of the present invention yield an advantage of the ability to stably recognize a position of a lower supporting pin with superior recognition accuracy and are useful in a field of electronic parts mounting for mounting electronic parts on a substrate holded by a substrate holding section.

DESCRIPTIONS OF THE REFERENCE NUMERALS AND SYMBOLS

1 ELECTRONIC PARTS MOUNTING APPARATUS
2 SUBSTRATE CONVEYANCE MECHANISM
2c SUBSTRATE HOLDING SECTION
3 SUBSTRATE
8 MOUNT HEAD
9 UNIT HOLDING HEAD
9a PICKUP NOZZLE
21 SUPPORT PLATE
24B UPPER SHAFT
24b RECOGNITION REFERENCE POSITION
26 SMALLER-DIAMETER SECTION
26a CONTACT SURFACE
26b SMALL DIAMETER PORTION
26d TAPERED PORTION

The invention claimed is:

1. A lower supporting pin layout determination apparatus which determines whether or not a lower supporting pin for receiving a downside of substrate is correctly arrayed in an electronic parts mounting apparatus that mounts electronic parts on a substrate held by a substrate holding section,
wherein the lower supporting pin has a shape including a base to be supported by a support plate placed in the substrate holding section, a shaft extending upward from the base, a smaller-diameter section that is on an upper portion of the shaft and in which an outer diameter of the shaft becomes smaller, and a contact surface that is formed on top of the smaller-diameter section and that contacts and receives a downside of the substrate; and
the lower supporting pin layout determination apparatus has:
an imaging unit that captures an image of the lower supporting pin from above, so as to acquire a planar image;
a shaft shape detection section that subjects the image to recognition processing, so as to detect an outer shape of the shaft at a recognition reference position set at a height where a transition occurs from an outer periphery of the shaft to the smaller-diameter section, the smaller-diameter section appearing as an area of the image that is dark in a bright background; and
a pin layout determination section that compares a planar position of the lower supporting pin determined from the detected outer shape with preset pin layout data, thereby determining whether or not the lower supporting pin is correctly arrayed,
wherein the shaft assumes a circular cross sectional profile; and
the smaller-diameter section includes a small diameter portion having an outer diameter smaller than an outer diameter of the shaft and the small diameter portion has on its top the contact surface and a tapered portion in which a periphery of the small diameter portion and a periphery of the shaft are interconnected unit of a conical tapered surface.

2. The lower supporting pin layout determination apparatus according to claim 1, wherein the shaft comprises an upper shaft connected to the smaller-diameter section and a lower shaft connected to the base, and the lower supporting pin further comprises a flange between the upper shaft and the lower shaft, a diameter of the flange is wider than a diameter of the upper shaft or the lower shaft and the diameter of the lower shaft is wider than the diameter of the upper shaft.

3. A lower supporting pin layout determination method for determining whether or not a lower supporting pin which receives a downside of a substrate is correctly arrayed in an electronic parts mounting apparatus that mounts electronic parts on the substrate held by a substrate holding section, wherein the lower supporting pin has a shape including a base to be supported by a support plate placed in the substrate holding section, a shaft extending upward from the base, a smaller-diameter section that is on an upper portion of the shaft and in which an outer diameter of the shaft becomes smaller, and a contact surface that is formed on top of the smaller-diameter section and that contacts and receives a downside surface of the substrate, the method comprising:
an imaging step of capturing an image of the lower supporting pin from above, to thus acquire a planar image;
a shaft shape detection step of subjecting the image to recognition processing, to thus detect an outer shape of the shaft at a recognition reference position set at a height where a transition occurs from an outer periphery of the shaft to the smaller-diameter section, the smaller-diameter section appearing as an area of the image that is dark in a bright background; and
a pin layout determination step of comparing a planar position of the lower supporting pin determined from the detected outer shape with preset pin layout data, thereby determining whether or not the lower supporting pin is correctly arrayed,
wherein the shaft assumes a circular cross sectional profile; and
the smaller-diameter section includes a small diameter portion having an outer diameter smaller than an outer diameter of the shaft and the small diameter portion has on its top the contact surface and a tapered portion in which a periphery of the small diameter portion and a periphery of the shaft are interconnected by a conical tapered surface.

4. The lower supporting pin layout determination method according to claim 3, wherein the shaft comprises an upper shaft connected to the smaller-diameter section and a lower shaft connected to the base, and the lower supporting pin further comprises a flange between the upper shaft and the lower shaft, a diameter of the flange is wider than a diameter of the upper shaft or the lower shaft and the diameter of the lower shaft is wider than the diameter of the upper shaft.

* * * * *